United States Patent
Yoon et al.

(10) Patent No.: US 11,557,723 B2
(45) Date of Patent: Jan. 17, 2023

(54) SEMICONDUCTOR DEVICE AND METHOD OF MANUFACTURING THE SAME

(71) Applicant: Samsung Electronics Co., Ltd., Suwon-si (KR)

(72) Inventors: Jungho Yoon, Yongin-si (KR); Soichiro Mizusaki, Suwon-si (KR); Youngjin Cho, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 86 days.

(21) Appl. No.: 16/658,864

(22) Filed: Oct. 21, 2019

(65) Prior Publication Data

US 2020/0266345 A1 Aug. 20, 2020

(30) Foreign Application Priority Data

Feb. 18, 2019 (KR) .......................... 10-2019-0018818

(51) Int. Cl.
*H01L 45/00* (2006.01)
*H01L 27/24* (2006.01)
*G11C 13/00* (2006.01)

(52) U.S. Cl.
CPC ...... *H01L 45/1253* (2013.01); *G11C 13/0004* (2013.01); *G11C 13/0007* (2013.01); *H01L 27/24* (2013.01); *H01L 45/145* (2013.01); *H01L 45/1608* (2013.01)

(58) Field of Classification Search
CPC .............. H01L 45/1233; H01L 45/124; H01L 27/2454; H01L 45/1691; H01L 45/145; H01L 27/249; H01L 27/2463; H01L 27/2409; H01L 45/146; H01L 27/2481; G11C 2213/77
See application file for complete search history.

(56) References Cited

U.S. PATENT DOCUMENTS

| | | |
|---|---|---|
| 8,198,160 B2 | 6/2012 | Liu |
| 8,803,122 B2 | 8/2014 | Tan et al. |
| 8,890,110 B2 | 11/2014 | Park |
| 9,202,566 B2 | 12/2015 | Siau et al. |
| 9,305,929 B1 | 4/2016 | Karda et al. |
| 9,672,917 B1 | 6/2017 | Costa et al. |
| 10,008,666 B2 | 6/2018 | Cho et al. |
| 2008/0121863 A1* | 5/2008 | Chen ................... H01L 45/1691 438/102 |
| 2011/0155989 A1* | 6/2011 | Park ..................... H01L 45/124 438/102 |
| 2012/0261638 A1 | 10/2012 | Sills et al. |

(Continued)

FOREIGN PATENT DOCUMENTS

KR 10-1511871 B1 4/2015

*Primary Examiner* — Samuel A Gebremariam
*Assistant Examiner* — Jonas T Beardsley
(74) *Attorney, Agent, or Firm* — Harness, Dickey & Pierce, P.L.C.

(57) ABSTRACT

A semiconductor device is provided. The semiconductor device includes a substrate a substrate, a first electrode structure on the substrate, the first electrode structure including first insulating patterns and first electrode patterns, the first insulating patterns alternately stacked with the first electrode patterns, a second electrode pattern on a sidewall of the first electrode structure, and a data storage film on a sidewall of the second electrode pattern. The data storage film has a variable resistance.

19 Claims, 20 Drawing Sheets

(56) References Cited

U.S. PATENT DOCUMENTS

| | | |
|---|---|---|
| 2013/0009122 A1 | 1/2013 | Park et al. |
| 2013/0048938 A1* | 2/2013 | Shintani .................. H01L 45/06 257/4 |
| 2013/0334488 A1 | 12/2013 | Park |
| 2015/0076438 A1* | 3/2015 | Cho ...................... H01L 27/101 257/4 |
| 2015/0287459 A1 | 10/2015 | Navon et al. |
| 2018/0211703 A1 | 7/2018 | Choi et al. |

* cited by examiner

SEMICONDUCTOR DEVICE AND METHOD OF MANUFACTURING THE SAME

CROSS-REFERENCE TO RELATED APPLICATION

This application claims the benefit of Korean Patent Application No. 10-2019-0018818, filed on Feb. 18, 2019, in the Korean Intellectual Property Office, the disclosure of which is incorporated herein in its entirety by reference.

BACKGROUND

Example embodiments relate to semiconductor devices and/or methods of manufacturing the semiconductor devices.

As a semiconductor memory device, a non-volatile memory device includes a plurality of memory cells that maintain information even if power is turned off, and the information stored in the memory cells may be re-used when power is re-supplied. As an example of a non-volatile memory apparatus, a non-volatile memory device may be used in mobile phones, digital cameras, personal digital assistances (PDAs), mobile computer devices, fixed computer devices, and/or other devices.

Recently, studies have been conducted to use a three-dimensional (or vertical) NAND (VNAND) in a chip that constitutes or are included in a next-generation neuromorphic computing platform or neural network.

SUMMARY

Provided are semiconductor devices having increased integrity and/or reliability.

Provided are semiconductor devices having improved electrical characteristics.

Provided are methods of manufacturing a semiconductor device having increased integrity and/or reliability.

Provided are methods of manufacturing a semiconductor device having improved electrical characteristics.

Additional aspects will be set forth in part in the description which follows and, in part, will be apparent from the description, or may be learned by practice of the example embodiments.

According to some example embodiments, a semiconductor device includes a substrate, a first electrode structure on the substrate, the first electrode structure including first insulating patterns and first electrode patterns, the first insulating patterns alternately stacked with the first electrode patterns, a second electrode pattern on a sidewall of the first electrode structure, and a data storage film on a sidewall of the second electrode pattern. The data storage film has a variable resistance.

The data storage film may extend on the first electrode pattern and electrically connect the first electrode pattern to the second electrode pattern.

An oxygen vacancy may be provided inside the data storage film, and the resistance of the data storage film may be changed by the density of the oxygen vacancy.

The data storage film may include a dielectric film through which the oxygen vacancy is moved.

The data storage film may include a phase change material.

The semiconductor device may further include a second insulating pattern between the second electrode pattern and the first electrode structure.

The second electrode pattern may extend along a surface of the first electrode structure, and the first electrode structure may be arranged between the second electrode pattern and the substrate.

The second electrode pattern may have a constant thickness.

A distance between an upper surface of the second electrode pattern and an upper surface of the substrate may be constant.

The first electrode structure may be provided as a plurality of first electrode structures each identical to the first electrode structure, and the second electrode pattern may extend in a direction crossing the plurality of the first electrode structures and may overlap the first electrode structures in a direction perpendicular to the upper surface of the substrate.

The second electrode pattern may be provided as a plurality of second electrode patterns each identical to the second electrode pattern, and the first electrode structure may extend in a direction crossing the plurality of second electrode patterns and may overlap the plurality of second electrode patterns in a direction perpendicular to the upper surface of the substrate.

The second electrode pattern may extend on the substrate, and the data storage film may expose the second electrode pattern on the substrate.

The semiconductor device may further include a selection device structure arranged on a side opposite to the first electrode structure with respect to the second electrode pattern, wherein when the data storage film has unipolar resistance switching-type characteristics, the selection device structure may include a PN junction diode or a Schottky diode, and when the data storage film has bipolar resistance switching-type characteristics, the selection device structure may include a non-linear selection device or a threshold switching device.

According to an aspect of some example embodiments, a semiconductor device includes a substrate including a cell array region and a connection region, a first electrode structure extending from the cell array region to the connection region, a second electrode structure on a sidewall of the first electrode structure in the cell array region, and a data storage film in the cell array region, the data storage film covering the first electrode structure and the second electrode structure. The first electrode structure comprises a plurality of steps in the connection region. The data storage film has a variable resistance.

The first electrode structure may include first insulating patterns and first electrode patterns that are alternately stacked on the substrate, and upper surfaces of the first electrode patterns may be exposed in the connection region and may be arranged along an extension direction of the first electrode structure.

The second electrode structure may include a second insulating pattern and a second electrode pattern that extend on the substrate, and the data storage film may expose an upper surface of the second electrode pattern on the substrate.

According to an aspect of some example embodiments, a method of manufacturing a semiconductor device includes forming a first electrode structure on a substrate, the first electrode structure including first insulating patterns and first electrode patterns that are alternately stacked, forming a second electrode structure on the first electrode structure, the second electrode structure including a second insulating pattern and a second electrode pattern that are sequentially stacked, and forming a data storage film on the first electrode structure and the second electrode structure. The data storage film has a variable resistance.

The forming of the data storage film may include conformally depositing an oxide film on a surface of the first electrode structure and a surface of the second electrode structure.

The method may further include forming step differences on an edge unit of the first electrode structure such that upper surfaces of the first electrode patterns are exposed.

The forming of the second electrode structure may include conformally and sequentially depositing a second insulating film and a second electrode film on the first electrode structure, and forming the second electrode pattern and the second insulating pattern by sequentially etching the second electrode film and the second insulating film.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF EXAMPLE EMBODIMENTS

Figure 1:
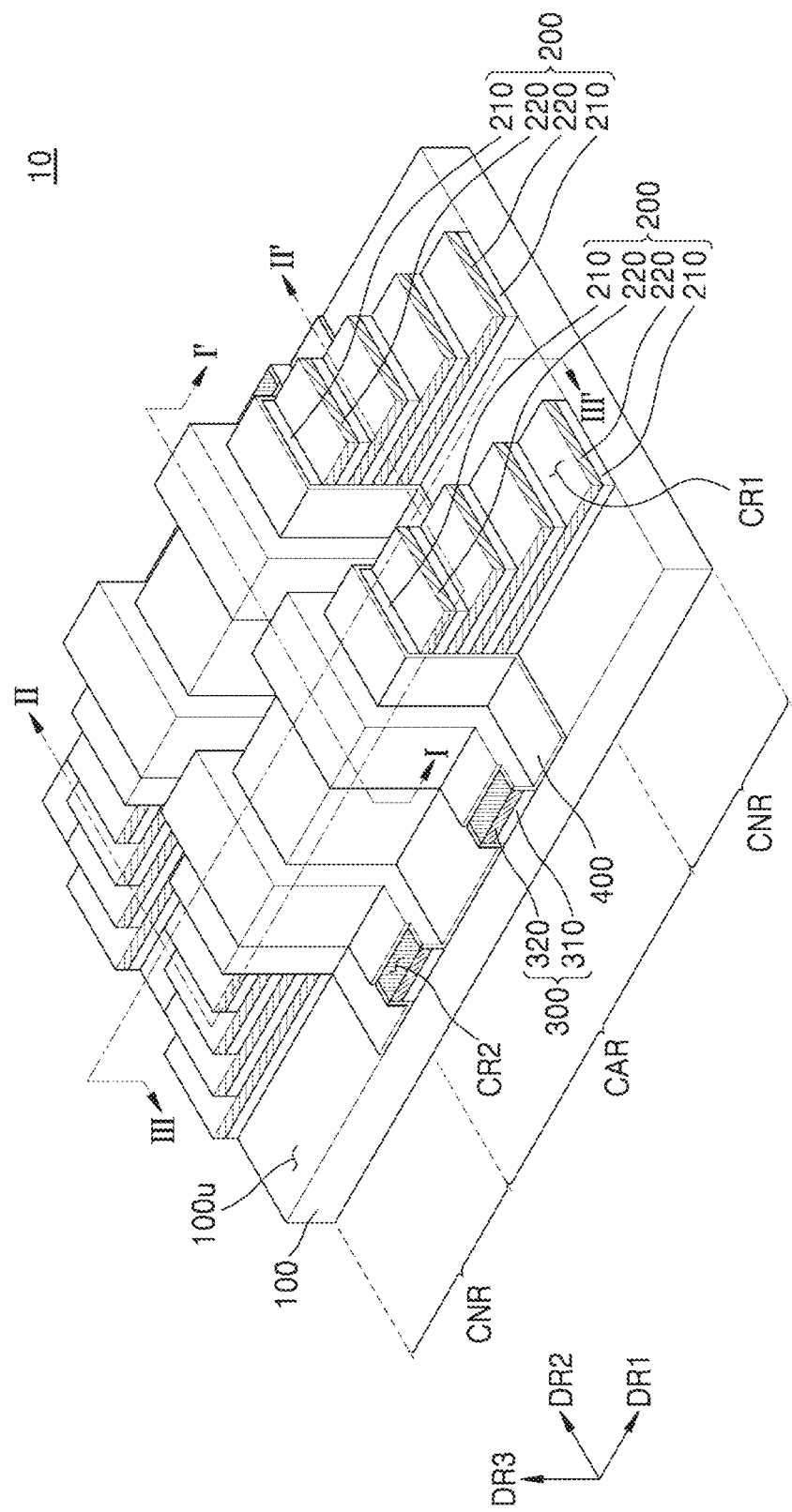
FIG. 1 is a perspective view of a semiconductor device according to example embodiments.

Reference will now be made in detail to some embodiments, examples of which are illustrated in the accompanying drawings, wherein like reference numerals refer to like elements throughout and sizes of each of constituent elements may be exaggerated for convenience of explanation and clarity of the specification. In this regard, example embodiments may have different forms and should not be construed as being limited to the descriptions set forth herein.

It will also be understood that when an element is referred to as being "on" or "above" another element, the element may be in direct contact with the other element or other intervening elements may be present.

In the following embodiments, the singular forms may include the plural forms unless the context clearly indicates otherwise. Also, when a region "includes" an element, the region may further include another element instead of excluding the other element, unless otherwise differently stated.

Also, in the specification, the terms "units" or "modules" denote units or modules that process at least one function or operation, and may be realized by hardware, software, or a combination of hardware and software.

Figure 2A:
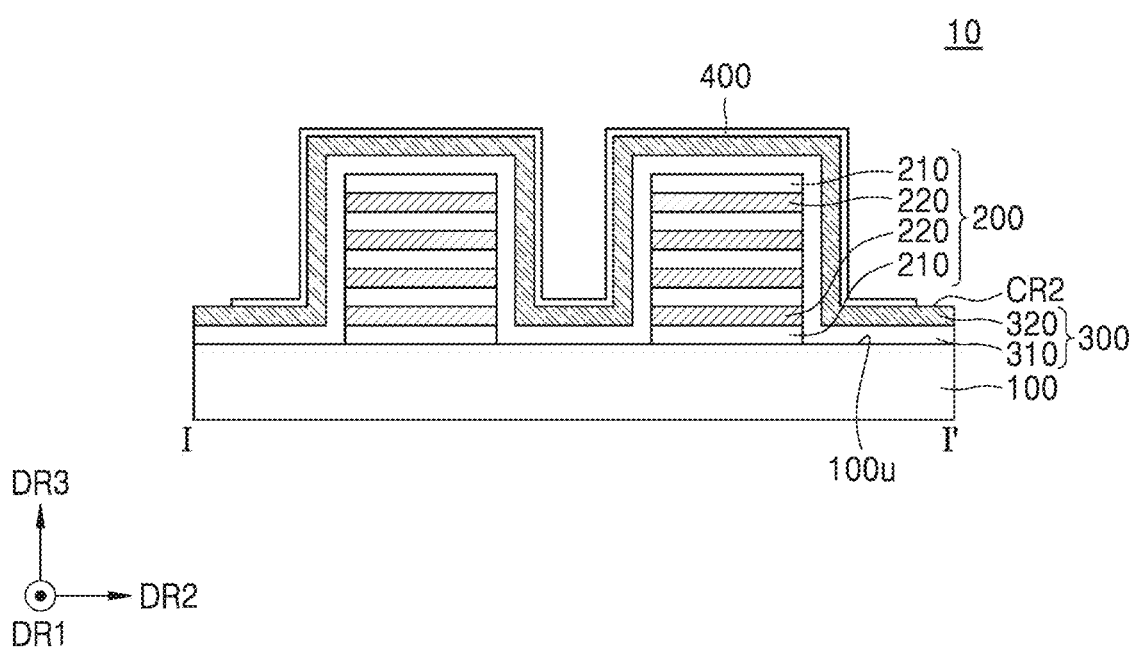
FIG. 2A is a cross-sectional view taken along line I-I' of FIG. 1.
Figure 2B:
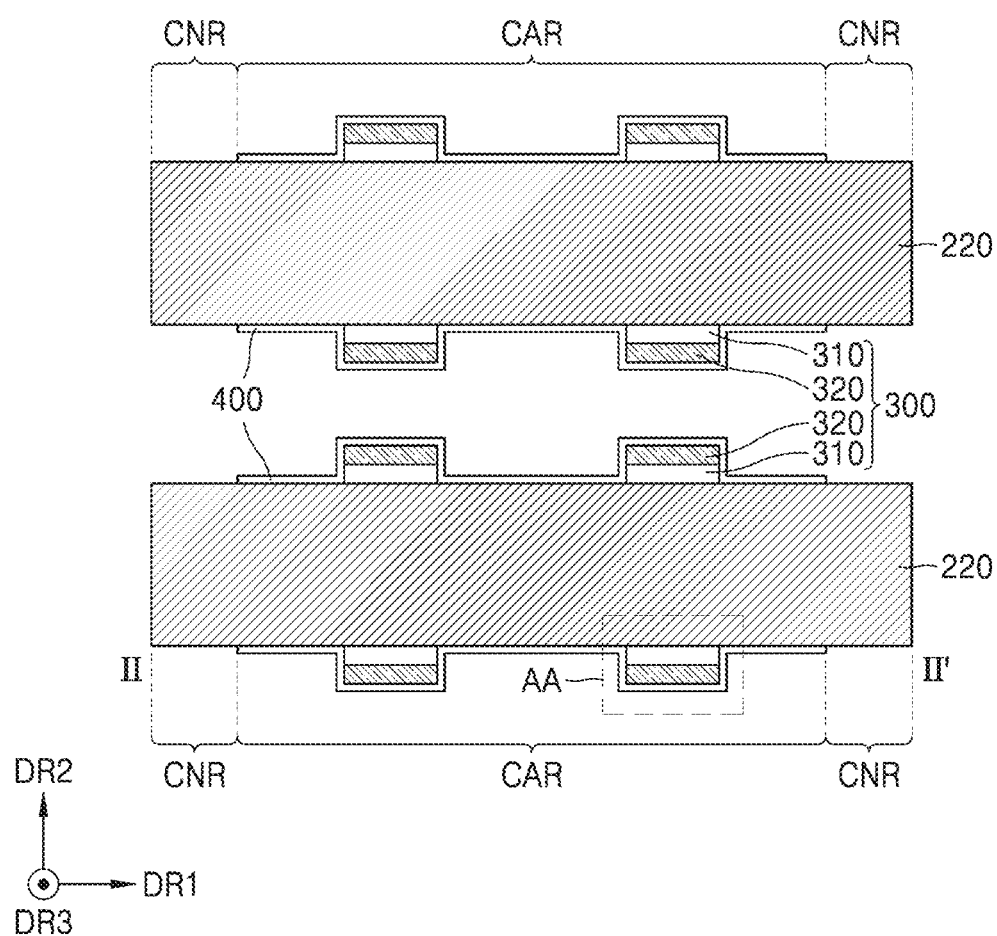
FIG. 2B is a cross-sectional view taken along line II-II' of FIG. 1.
Figure 2C:
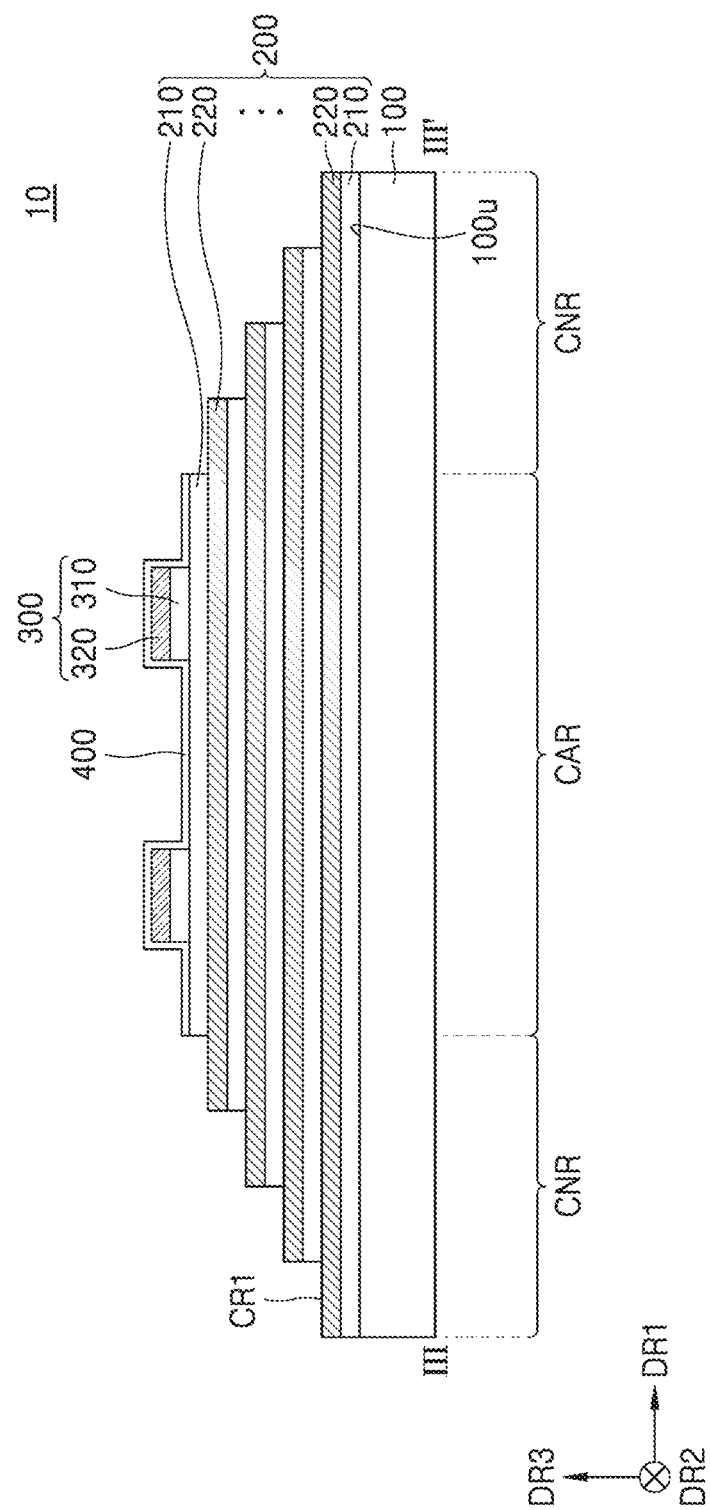
FIG. 2C is a cross-sectional view taken along line III-III' of FIG. 1.
Figure 3:
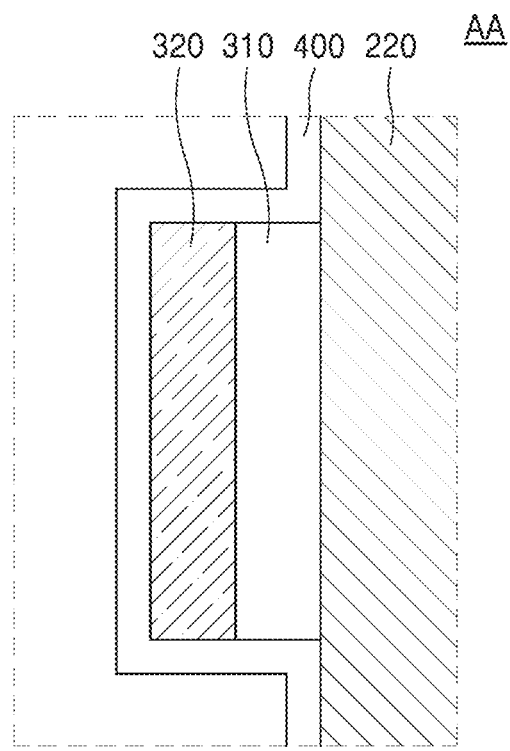
FIG. 3 is a magnified view of a region AA of FIG. 2B.

FIG. 1 is a perspective view of a semiconductor device according to example embodiments. FIG. 2A is a cross-sectional view taken along line I-I' of FIG. 1. FIG. 2B is a cross-sectional view taken along line II-II' of FIG. 1. FIG. 2C is a cross-sectional view taken along line III-III' of FIG. 1. FIG. 3 is a magnified view of AA region of FIG. 2B.

Referring to FIGS. 1, 2A, 2B, and 2C, a semiconductor device 10 may be provided. The semiconductor device 10 may include a non-volatile memory device. For example, the semiconductor device 10 may be or include a non-volatile memory device that uses a variable resistance material and/or a phase change material. The semiconductor device 10 may include a substrate 100, first electrode structures 200, second electrode structures 300, and a data storage film 400. The substrate 100 may include a cell array region CAR and a pair of connection regions CNR. The cell array region CAR may be a region where cells that store data are arranged. The pair of connection regions CNR may be regions where first contacts (not shown) are arranged. The first contacts may be electrically connected to the first electrode structures 200. For example, the first contacts may include a conductive material, such as a metal and/or doped polysilicon. An external voltage may be applied to the first electrode structures 200 by the first contacts. The pair of connection regions CNR may be separated by the cell array region CAR therebetween. The substrate 100 may include an insulating material. For example, the substrate 100 may include at least one of silicon oxide, silicon nitride, or silicon oxynitride.

The first electrode structures 200 may be arranged on the substrate 100. The first electrode structures 200 may extend in a first direction DR1, which is parallel to an upper surface 100$u$ of the substrate 100. The first electrode structures 200 may be arranged in a second direction DR2, which is crossing the first direction DR1. Either or both of the first direction DR1 and the second direction DR2 may be parallel to the upper surface 100$u$ of the substrate 100.

Each of the first electrode structures 200 may include first insulating patterns 210 and first electrode patterns 220. The first insulating patterns 210 and the first electrode patterns 220 may be alternately stacked in a third direction DR3, which is perpendicular to the upper surface 100$u$ of the substrate 100. The first insulating patterns 210 may be electrically shorted with the first electrode patterns 220. In some example embodiments, the lowermost films and the uppermost films of the first electrode structures 200 may include the first insulating patterns 210. The first insulating patterns 210 may include an insulating material. For example, the first insulating patterns 210 may include at least one of silicon oxide, silicon nitride, or silicon oxynitride.

The first electrode patterns 220 respectively may be electrically connected to word lines (not shown). For example, the first electrode patterns 220 and the word lines may be electrically connected by arranging the first contacts respectively between the first electrode patterns 220 and the word lines. An external voltage may be applied to the first electrode patterns 220 through the first contacts. The first electrode patterns 220 may include a conductive material. For example the first electrode patterns 220 may include a metal and/or a doped semiconductor material. When the first electrode patterns 220 include a metal, the first electrode patterns 220 may include, for example, Pt, Pd, Ti, Ta, W, or a combination of these materials. When the first electrode patterns 220 include a doped semiconductor material, the first electrode patterns 220 may include, for example, doped Si, doped Ge, doped GaAs, or a combination of these materials.

The first electrode structures 200 may include step differences in the pair of connection regions CNR. A single layer of the first electrode structures 200 defined by the step differences the first insulating pattern 210 and the first electrode pattern 220. The first insulating pattern 210 and the first electrode pattern 220 in the single layer of the first electrode structures 200 may completely overlap each other along the third direction DR3. However, the uppermost layer may include the first insulating pattern 210. For example, the uppermost layer may not include the first electrode pattern 220.

In the pair of connection regions CNR, the first electrode patterns 220 in the relatively lower layers may protrude further along the first direction DR1 from the first electrode patterns 220 in the relatively higher layers. The first electrode patterns 220 may be exposed in the pair of connection regions CNR. For example, upper surfaces of the first electrode patterns 220 may be exposed in the pair of connection regions CNR. The exposed upper surface of the first electrode patterns 220 may be referred to as first contact regions CR1. In a planar view, the first contact regions CR1 may be arranged in the first direction DR1. First contacts respectively electrically connected to each other in the first contact regions CR1. For example, the first contact regions CR1 respectively may contact, e.g. directly contact, the first contacts.

The second electrode structures 300 may be provided on the substrate 100 and may extend in the second direction DR2. The second electrode structures 300 may extend along surfaces of the first electrode structures 200. In a planar view, the second electrode structures 300 may cross the first electrode structures 200. The second electrode structures 300 may be separated from the substrate 100 with the first electrode structures 200 therebetween. The first electrode structures 200 may be provided between the second electrode structures 300 and the substrate 100.

Each of the second electrode structures 300 may include a second insulating pattern 310 and a second electrode pattern 320. The second insulating pattern 310 and the second electrode pattern 320 may be sequentially stacked on the substrate 100 and the first electrode structure 200. The second insulating pattern 310 is provided on the substrate 100 and may extend in the second direction DR2. The second insulating pattern 310 may extend along a surface of the first electrode structure 200. In a planar view, the second insulating pattern 310 may cross the first electrode structures 200. The second insulating pattern 310 may prevent the second electrode pattern 320 from being electrically connected to the first electrode patterns 220. The second electrode pattern 320 and the first electrode patterns 220, e.g. the first electrode patterns 220 in the highest layer, may be electrically disconnected by the second insulating pattern 310. The second insulating pattern 310 may include an insulating material. For example, the second insulating pattern 310 may include at least one of silicon oxide, silicon nitride, or silicon oxynitride.

The second electrode pattern 320 may be provided on the second insulating pattern 310. The second electrode pattern 320 may extend along the second insulating pattern 310. The second electrode pattern 320 may conformally cover an upper surface of the second insulating pattern 310. The second electrode pattern 320 may be electrically connected to a bit line by second contacts (not shown). For example, the second contacts may include a conductive material, such as, but not limited to, metal and/or doped polysilicon. An external voltage may be applied to the second electrode pattern 320 through the second contacts. The second electrode pattern 320 may include second contact regions CR2. For example, the second contact regions CR2 may be provided by both edges along the second direction DR2. The second contacts may be electrically connected to the second contact regions CR2. For example, the second contacts may directly contact the second contact regions CR2. The second electrode pattern 320 may include a conductive material. For example, the second electrode pattern 320 may include a metal or a doped semiconductor material. When the second electrode pattern 320 includes a metal, the second electrode pattern 320 may include, for example, Pt, Pd, Ti, Ta, W, or a combination of these materials. When the second electrode pattern 320 includes a doped semiconductor material, the second electrode pattern 320 may include, for example, doped Si, doped Ge, doped GaAs, or a combination of these materials.

The data storage film 400 may be provided on the first electrode structures 200 and the second electrode structures 300. The data storage film 400 may cover the first electrode structures 200 and the second electrode structures 300. For example, the data storage film 400 may conformally cover surfaces of the first electrode structures 200 and surfaces of the second electrode structures 300. As depicted in FIG. 3, the data storage film 400 may be provided on the second electrode pattern 320 and may extend on the first electrode patterns 220. The data storage film 400 may conformally cover the second electrode pattern 320, the second insulating pattern 310, and the first electrode patterns 220. The data storage film 400 may be electrically connected to the first electrode patterns 220 and the second electrode pattern 320. For example, the data storage film 400 may contact, e.g. directly contact, the first electrode patterns 220 and the second electrode pattern 320.

The data storage film 400 may have a variable resistance characteristic. The data storage film 400 may store data by using the variable resistance characteristic. The resistance of the data storage film 400 may change by an oxygen vacancy and/or phase change in the internal of the data storage film 400. When the resistance of the data storage film 400 is changed by the oxygen vacancy, the data storage film 400 may include a dielectric film through which the oxygen vacancy is moved (e.g., the oxygen vacancy is mobile). For example, the data storage film 400 may include an oxide film and/or a nitride film. When the data storage film 400 includes an oxide film, the data storage film 400 may include, for example, $HfO_2$, $Al_2O_3$, $Ta_2O_5$, $TiO_2$, or a combination of these materials. When the data storage film 400 includes a nitride film, the data storage film 400 may include, for example, SiN. In an example embodiment, the resistance of the data storage film 400 may change according to the density of oxygen vacancies in the data storage film 400. When the density of the oxygen vacancy in the data storage film 400 is high, the data storage film 400 may have a low, e.g. relatively low, resistance state. When the density of the oxygen vacancy in the data storage film 400 is low, the data storage film 400 may have a high, e.g. relatively high, resistance state. In an example embodiment, the resistance of the data storage film 400 may be changed according to whether or not electrons are seized in traps inside the data storage film 400. The traps may be formed by the oxygen vacancy. When electrons are seized in the traps inside the data storage film 400, the data storage film 400 may have a low (or relatively low) resistance state. When the electrons are not seized in the traps inside the data storage film 400, the data storage film 400 may have a high (or relatively high) resistance state.

In an example embodiment, the data storage film 400 may include a phase change material. For example, the data storage film 400 may include $Ge_2Sb_2Te_5$ (GST). When the data storage film 400 has a crystalline state, the data storage film 400 may have a low, or relatively low, resistance state. When the data storage film 400 has an amorphous state, the data storage film 400 may have a high, or relatively high, resistance state.

When a voltage is applied to the first electrode patterns 220 and the second electrode pattern 320, the resistance of the data storage film 400 may be changed between the first electrode patterns 220 and the second electrode pattern 320. For example, the data storage film 400 may have a low resistance state or a high resistance state. Accordingly, a voltage-current characteristic between the first electrode patterns 220 and the second electrode pattern 320 may be changed. The data storage film 400 between the first electrode patterns 220 and the second electrode pattern 320 may be defined as, e.g. correspond to, a single cell. For example, as depicted in FIG. 2B, four parts of the data storage film 400 may be arranged between the first electrode patterns 220 and the second electrode pattern 320. The four parts may be, or correspond to, a single cell. An area of the single cell may be proportional to a thickness of the data storage film 400 and a thickness of the first electrode patterns 220. The thickness of the first electrode patterns 220 may be a size of the first electrode patterns 220 along the third direction DR3. For example, when the single cell includes the four parts of the data storage film 400, the area of the single cell may be defined as follows.

Cell area=4×(thickness of the data storage film 400)×(thickness of the first electrode patterns 220)     (Equation 1)

Referring to equation 1, the thickness of the data storage film 400 and the thickness of the first electrode patterns 220 may be controlled by a deposition process. For example, the area of the single cell may be controlled by controlling of conditions such as temperature, pressure, flow rate, and/or other items, associated with a deposition process. Due to the limitation of a linewidth of a photolithography process, a size of pattern formed by an etching process may be approximately 10 nm or greater. However, a film formed by a deposition process may have a thickness in a range from about 1 nm to about 2 nm or less. The single cell according to example embodiments is formed by a deposition process, and thus, may have less area than a cell formed by an etching process. The smaller the area of the single cell, the higher the cell integration density of a semiconductor device may be achieved. Example embodiments may provide the semiconductor device 10 having increased cell integration density.

The uniformity and/or reliability of a resistance variable phenomenon of the data storage film 400 may be increased as the size of a region in which the resistance variable phenomenon occurs is reduced. The resistance variable phenomenon according to example embodiments may occur inside the data storage film 400 arranged between the first electrode patterns 220 and the second electrode pattern 320. The data storage film 400 may be formed to be thin by a deposition process, such as a PECVD process, a low pressure CVD (LPCVD) process, and/or an atomic layer deposition (ALD) process. Example embodiments may provide the semiconductor device 10 having increased uniformity and reliability of the resistance variable phenomenon.

Data may be written in cells and/or erased from the cells by a resistance changing process of the data storage film 400. Data stored in the cells may be read by measuring a voltage-current characteristic between the first electrode patterns 220 and the second electrode pattern 320.

Figure 4:
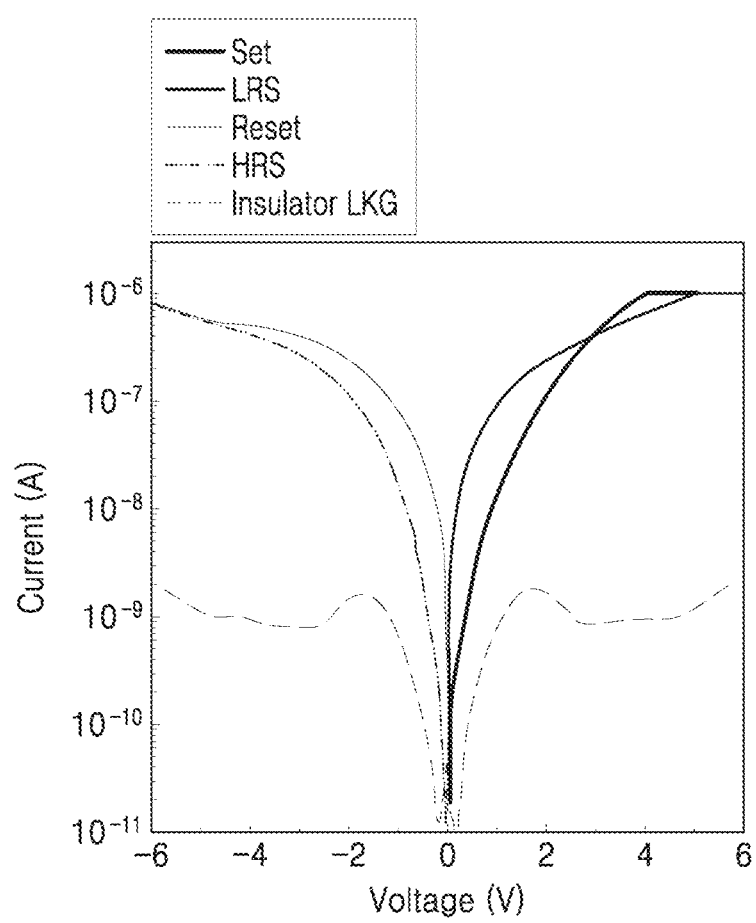
FIG. 4 is a graph of a voltage-current test of a data storage film including a variable resistance material.

FIG. 4 is a graph of a voltage-current test of a data storage film including a variable resistance material, according to some example embodiments.

Referring to FIG. 4, +6V was applied to the data storage film having an initial state (corresponding to the 'Set' line). The data storage film was changed to a low resistance state (corresponding to the IRS' line). −6V was applied to the data storage film having the low resistance state (corresponding to the IRS' line). The data storage film was changed again to an initial state (corresponding to the 'Reset' line). Again, −6V was applied to the data storage film having the initial state (corresponding to the 'Reset' line). The data storage film was changed to a high resistance state (corresponding to the 'HRS' line). Herein the voltages and/or currents disclosed in FIG. 4 are examples only, and inventive concepts are not limited thereto.

FIGS. 5-10 are perspective views for explaining a method of manufacturing a semiconductor device according to example embodiments.

Figure 5:
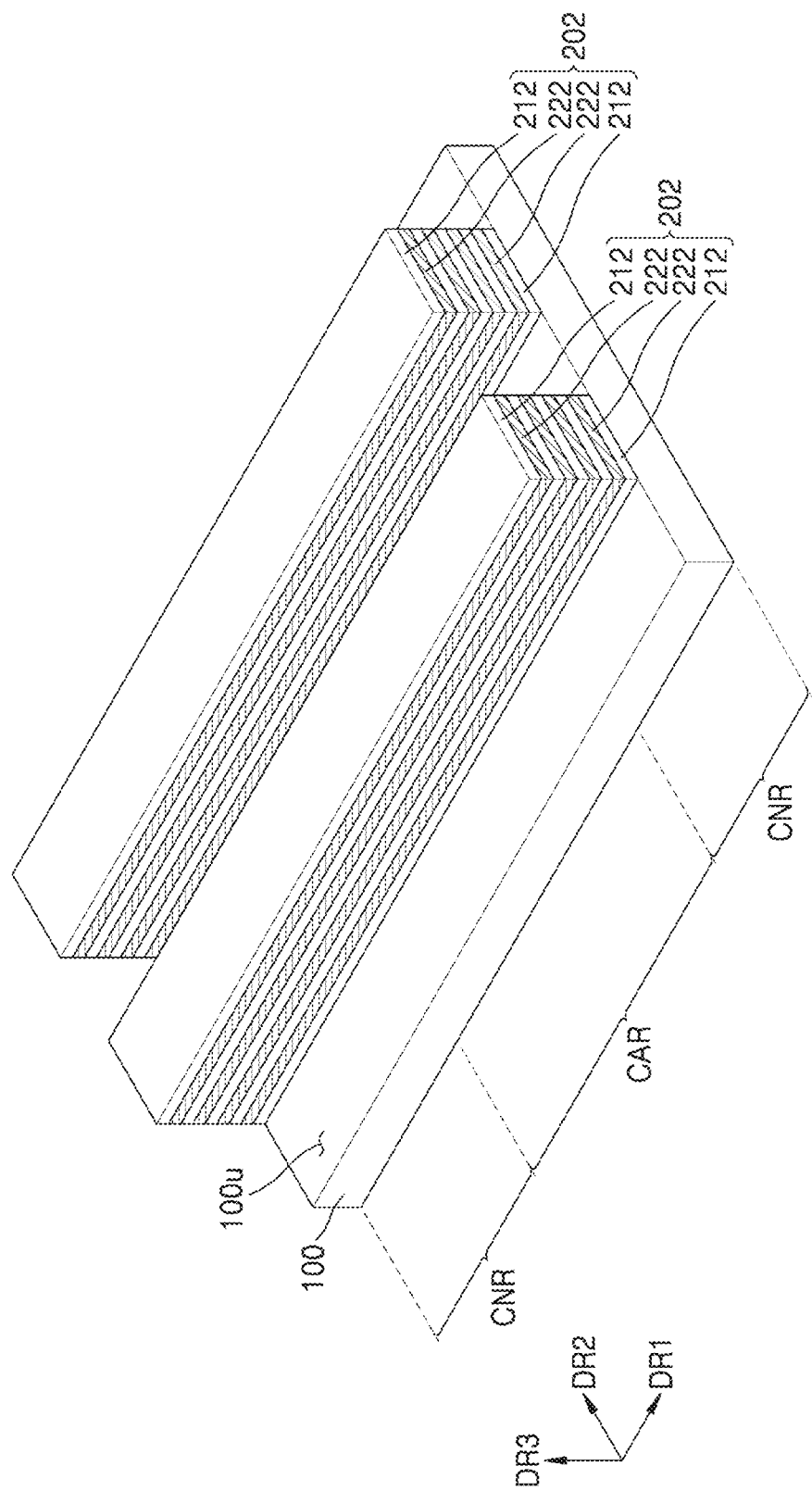
FIG. 5 is a perspective view for explaining a method of manufacturing a semiconductor device, according to example embodiments.

Referring to FIG. 5, first preliminary electrode structures 202 may be formed on the substrate 100. The substrate 100 may include a cell array region CAR and a pair of connection regions CNR. The substrate 100 may include an insulating material. For example, the substrate 100 may include at least one of silicon oxide, silicon nitride, or silicon oxynitride.

The formation of the first preliminary electrode structures 202 may include a process of alternately stacking first insulating films (not shown) and first electrode films (not shown) on the substrate 100, and patterning of the first insulating films and the first electrode films. The first insulating films and the first electrode films may be formed by using a chemical vapor deposition (CVD) process, such as a plasma-enhanced CVD (PECVD) process and/or an atomic layer deposition (ALD) process. The first insulating films and the first electrode films may be deposited on the cell array region CAR and the pair of connection regions CNR. The first insulating films may include an insulating material. For example, the first insulating films may include silicon oxide. The first electrode films may include a conductive material. For example, the first electrode films may include a metal and/or a doped semiconductor material such as single-crystal silicon and/or polysilicon doped with at least one of boron, phosphorous, or arsenic. When the first electrode films include a metal, the first electrode films may include, for example, Pt, Pd, Ti, Ta, W, or a combination of these materials. When the first electrode films include a doped semiconductor material, the first electrode films may include, for example, doped Si, doped Ge, doped GaAs, or a combination of these materials.

The patterning of the first insulating films and the first electrode films may include performing an etching process by using an etch mask (not shown). The etching process may be continued until the upper surface 100u of the substrate 100 is exposed. The etch mask may be at least partially removed in the course of the etching process, and/or after the etching process is completed. First preliminary insulating patterns 212 and first preliminary electrode patterns 222 respectively may be formed by patterning the first insulating films and the first electrode films. Each of the first preliminary electrode structures 202 may include alternately stacked first preliminary insulating patterns 212 and first preliminary electrode patterns 222.

Figure 6:
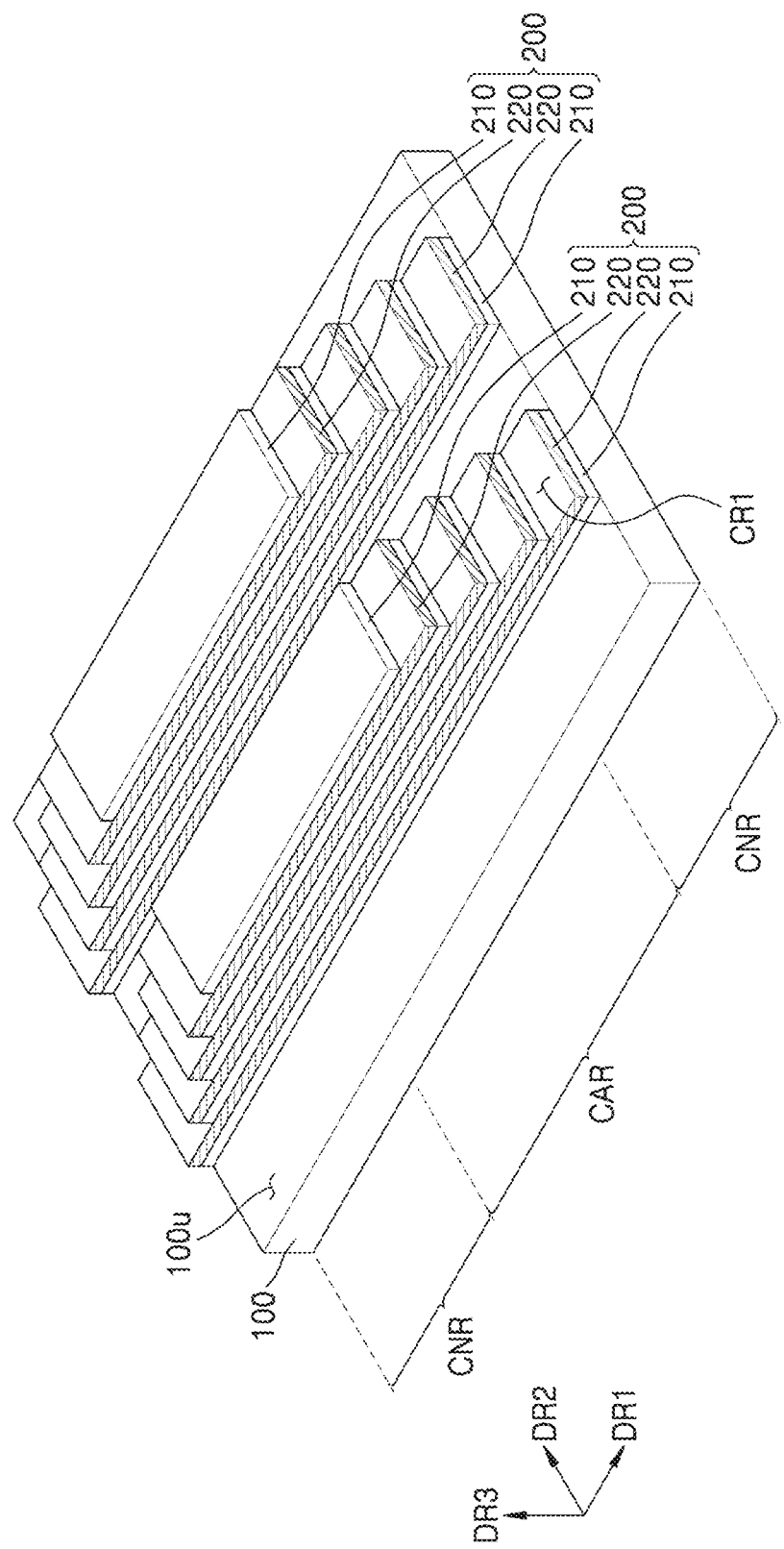
FIG. 6 is a perspective view for explaining a method of manufacturing a semiconductor device, according to example embodiments.

Referring to FIG. 6, the first electrode structures 200 may be formed by forming step differences, e.g. steps, in the first preliminary electrode structures 202 (refer to FIG. 5). The step differences may be formed in the pair of connection regions CNR. The step differences may be formed by etching processes that are performed at different times from each other with respect to different parts of the first preliminary electrode structures 202. For example, the number of etching processes with respect to parts near to the cell array region CAR may be less than the number of etching processes with respect to parts further away from the cell array region CAR. While the etching process is performed, a mask (not shown) may be formed on the cell array region CAR and may cover the first electrode structures 200. The first electrode structures 200 may include alternately stacked the first insulating patterns 210 and the first electrode patterns 220. The mask (not shown) may be or include a photosensitive material, such as photoresist.

Figure 7:
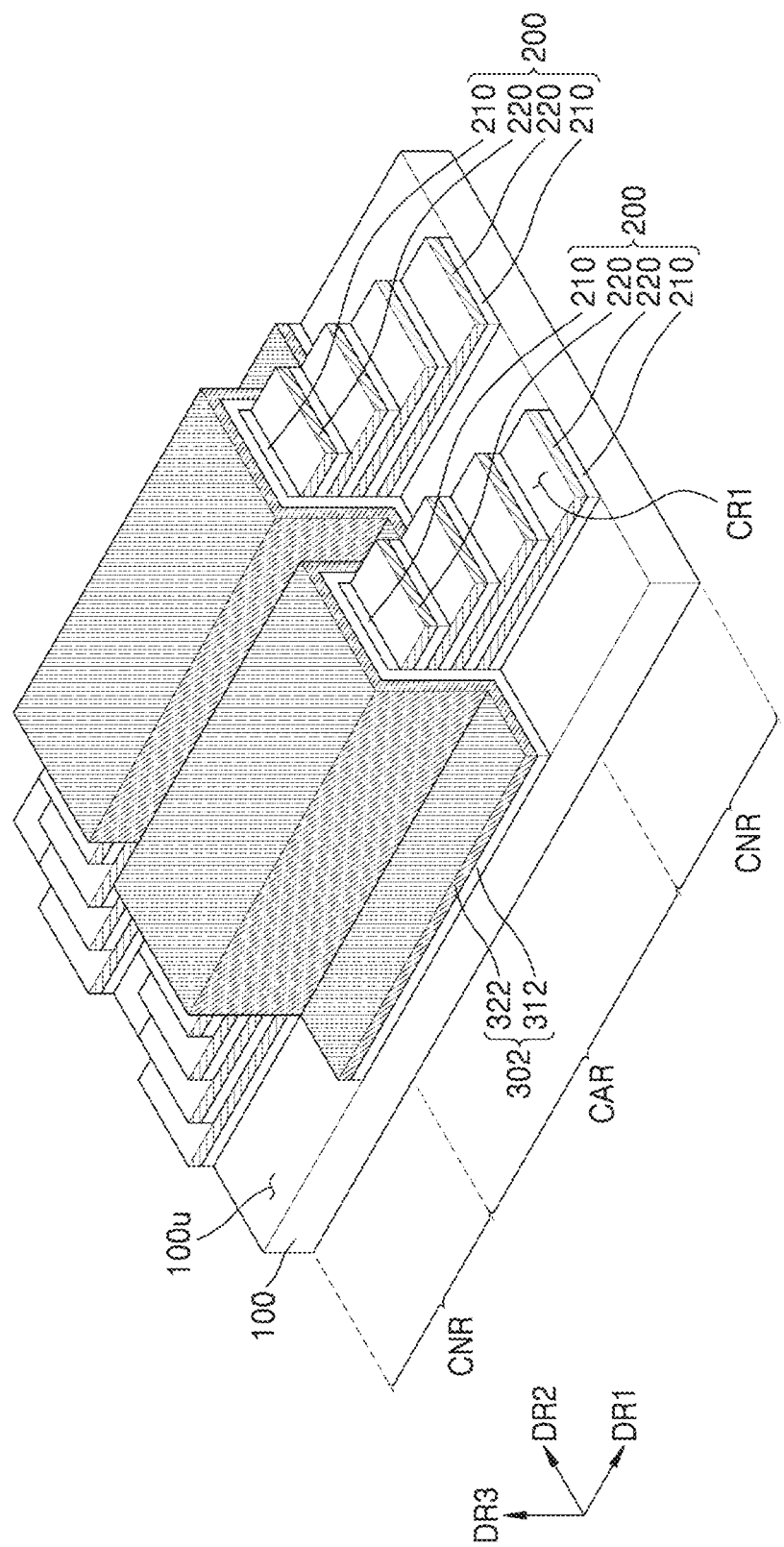
FIG. 7 is a perspective view for explaining a method of manufacturing a semiconductor device, according to example embodiments.

Referring to FIG. 7, a second preliminary electrode structure 302 may be formed on the first electrode structures 200. The second preliminary electrode structure 302 may be formed on the substrate 100 and the first electrode structures 200 in the cell array region CAR. The second preliminary electrode structure 302 may conformally cover an upper surface 100u of the substrate 100 and surfaces, including sidewall surfaces and upper surfaces, of the first electrode structures 200. The forming of the second preliminary electrode structure 302 may include sequentially depositing a second preliminary insulating film 312 and a second preliminary electrode film 322 on the substrate 100 and the first electrode structures 200. The deposition process may include a CVD process such as at least one of PECVD, LPCVD, or ALCVD. While the deposition process is performed, a mask (not shown) may be formed on the pair of connection regions CNR and may cover edge units of the first electrode structures 200. The second preliminary insulating film 312 may include an insulating material. For example, the second preliminary insulating film 312 may include at least one of silicon oxide, silicon nitride, or silicon oxynitride. The second preliminary electrode film 322 may include a conductive material. For example, the second preliminary electrode film 322 may include at least one of a metal or a doped semiconductor material. When the second preliminary electrode film 322 includes a metal, the second preliminary electrode film 322 may include, for example, Pt, Pd, Ti, Ta, W, or a combination of these materials. When the second preliminary electrode film 322 includes a doped semiconductor material, the second preliminary electrode film 322 may include, for example, doped Si, doped Ge, doped GaAs, or a combination of these materials. The doped semiconductor material may be in a single-crystal, or in a polycrystalline, phase. The doped semiconductor material may be doped with at least one of boron, phosphorous, or arsenic.

Figure 8:
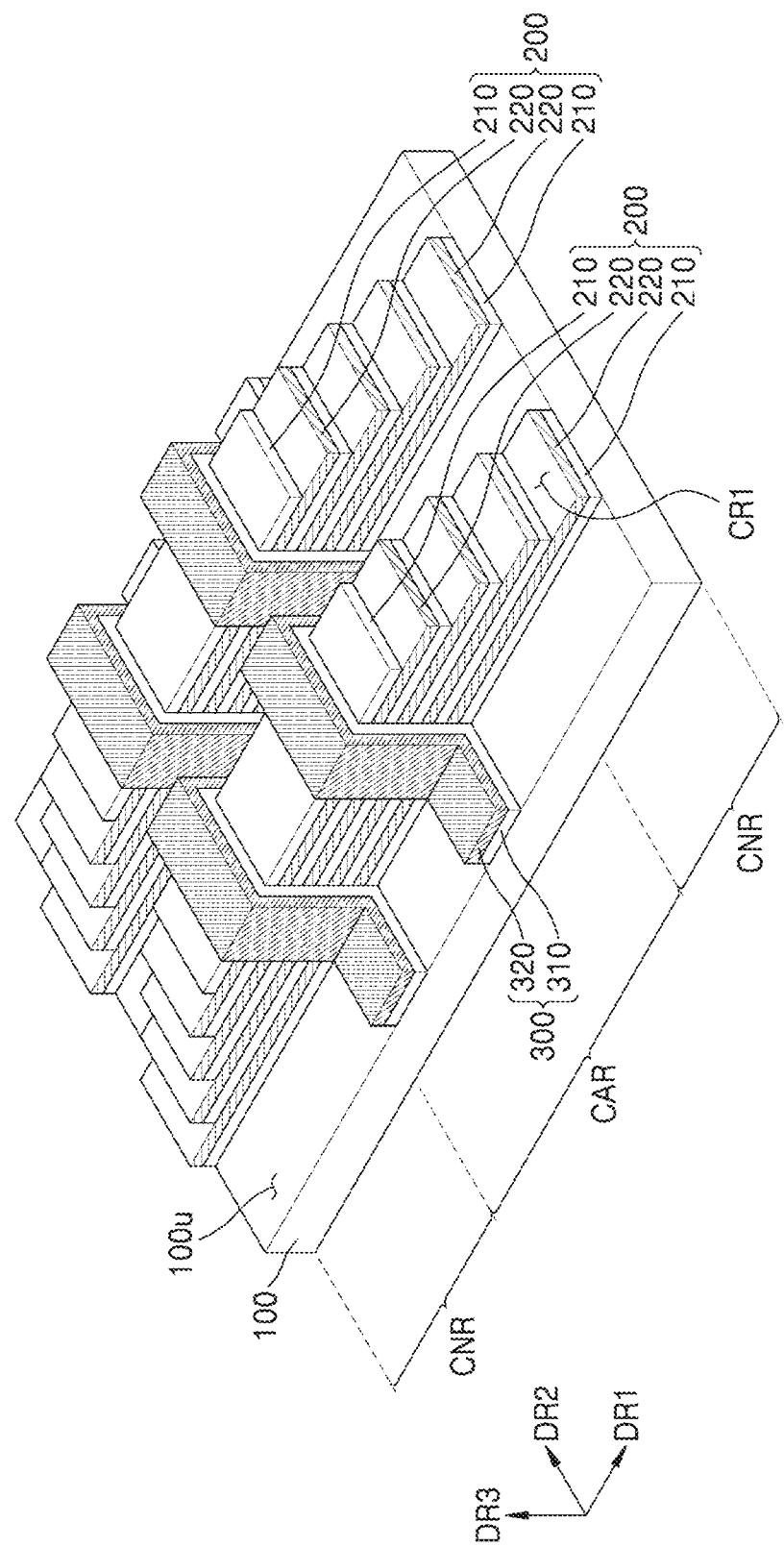
FIG. 8 is a perspective view for explaining a method of manufacturing a semiconductor device, according to example embodiments.

Referring to FIG. 8, the second preliminary electrode structure 302 (refer to FIG. 7) may be patterned, and thus, second electrode structures 300 may be formed. The second preliminary electrode structure 302 (refer to FIG. 7) may be patterned by performing an etching process in which an etch mask (not shown) is used on the second preliminary electrode film 322 (refer to FIG. 7) and the second preliminary insulating film 312 (refer to FIG. 7). The etching process may be performed until the first electrode structures 200 are exposed. For example, upper surfaces and side surfaces, e.g. sidewall surfaces, of the first electrode structures 200 may be exposed by the etching process. The second preliminary electrode film 322 (refer to FIG. 7) may be etched, and thus, second electrode patterns 320 may be formed. The second preliminary insulating film 312 (refer to FIG. 7) may be etched, and thus, second insulating patterns 310 may be formed.

Figure 9:
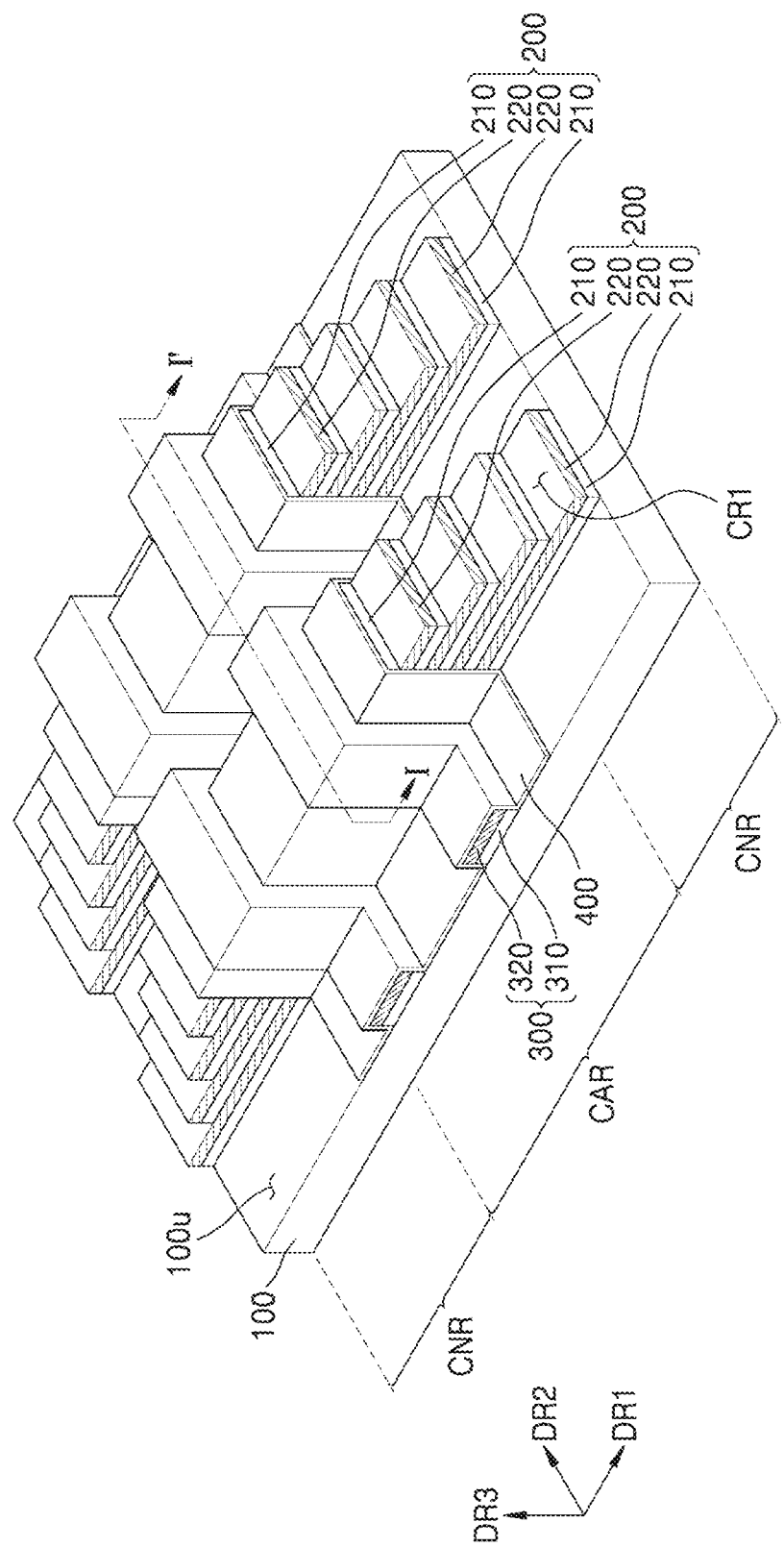
FIG. 9 is a perspective view for explaining a method of manufacturing a semiconductor device, according to example embodiments.
Figure 10:
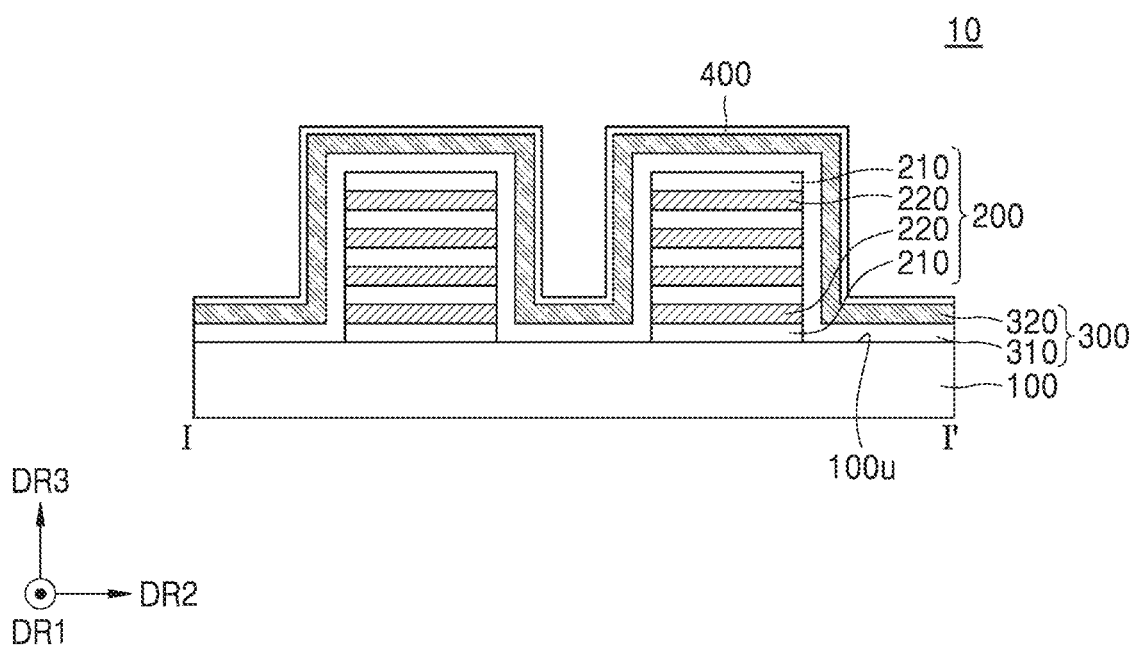
FIG. 10 is a cross-sectional view taken along line I-I' of FIG. 9.

Referring to FIGS. 9 and 10, a data storage film 400 may be formed on the first electrode structures 200 and the second electrode structures 300. The data storage film 400 may be deposited on the cell array region CAR so that the data storage film 400 may conformally cover the surfaces of the first electrode structures 200 and surfaces of the second electrode structures 300. The data storage film 400 may be formed by using a CVD process. The CVD process may include at least one of a PECVD process, an LPCVD process, or an ALCVD process. The resistance of the data storage film 400 may be changed by an oxygen vacancy and/or phase change inside the data storage film 400. When the resistance of the data storage film 400 is changed by the oxygen vacancy, the data storage film 400 may include a dielectric film through which the oxygen vacancy may be moved. For example, the data storage film 400 may include an oxide film or a nitride film. When the data storage film 400 includes an oxide film, the data storage film 400 may include, for example, $HfO_2$, $Al_2O_3$, $Ta_2O_5$, $TiO_2$, or a combination of these materials. When the data storage film 400 includes a nitride film, the data storage film 400 may include, for example, SiN. In some example embodiments, the data storage film 400 may include a phase change material. For example, the data storage film 400 may include GST.

Referring to FIG. 1, upper surfaces of the second electrode patterns 320 may be exposed by removing some portions of the data storage film 400. For example, an etching process using an etch mask (not shown) on the data storage film 400 may be performed on edge units of the second electrode patterns 320. The exposed upper surfaces of the second electrode patterns 320 may be referred to as second contact regions CR2.

Figure 11:
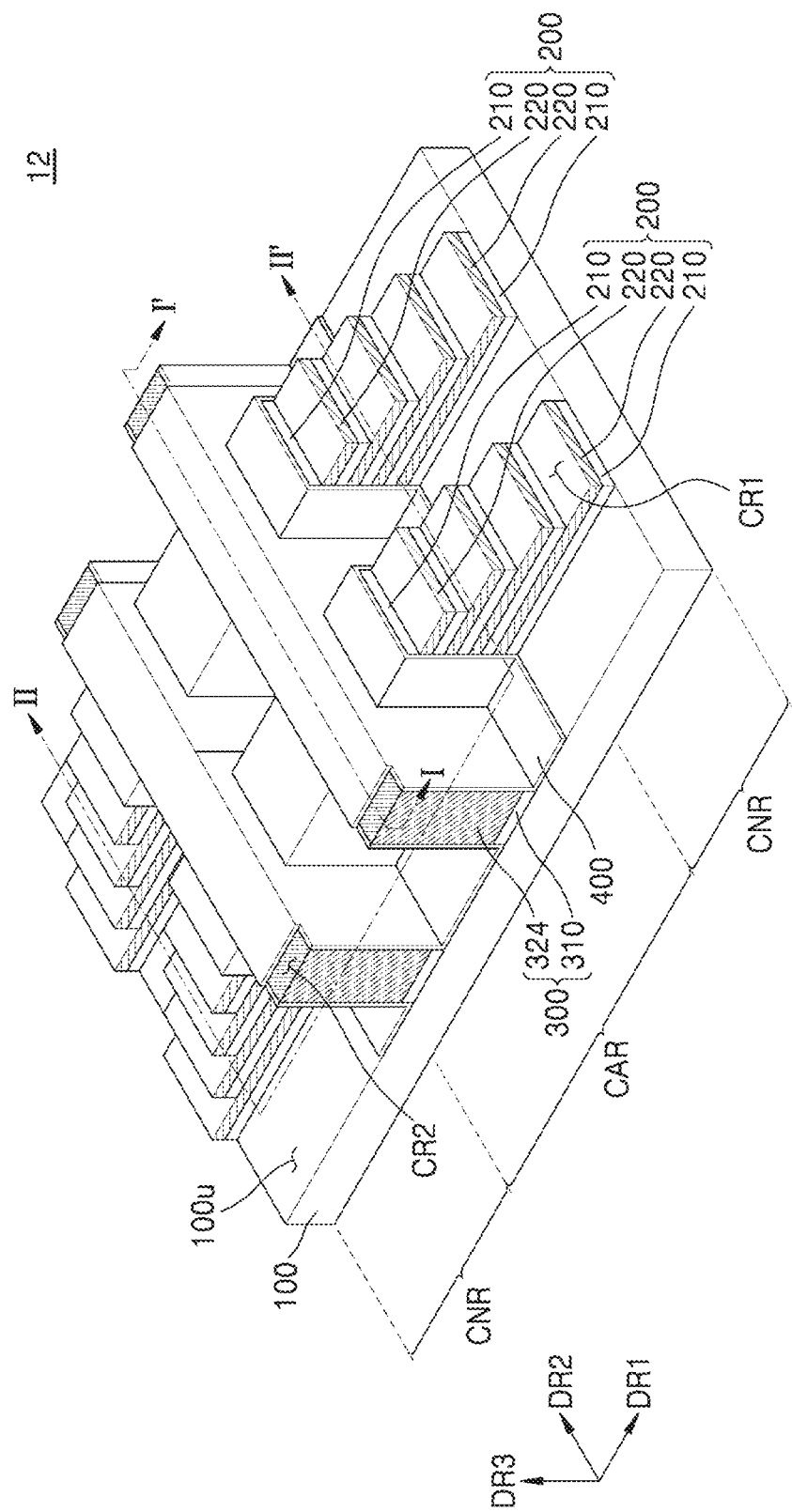
FIG. 11 is a perspective view of a semiconductor device according to example embodiments.
Figure 12A:
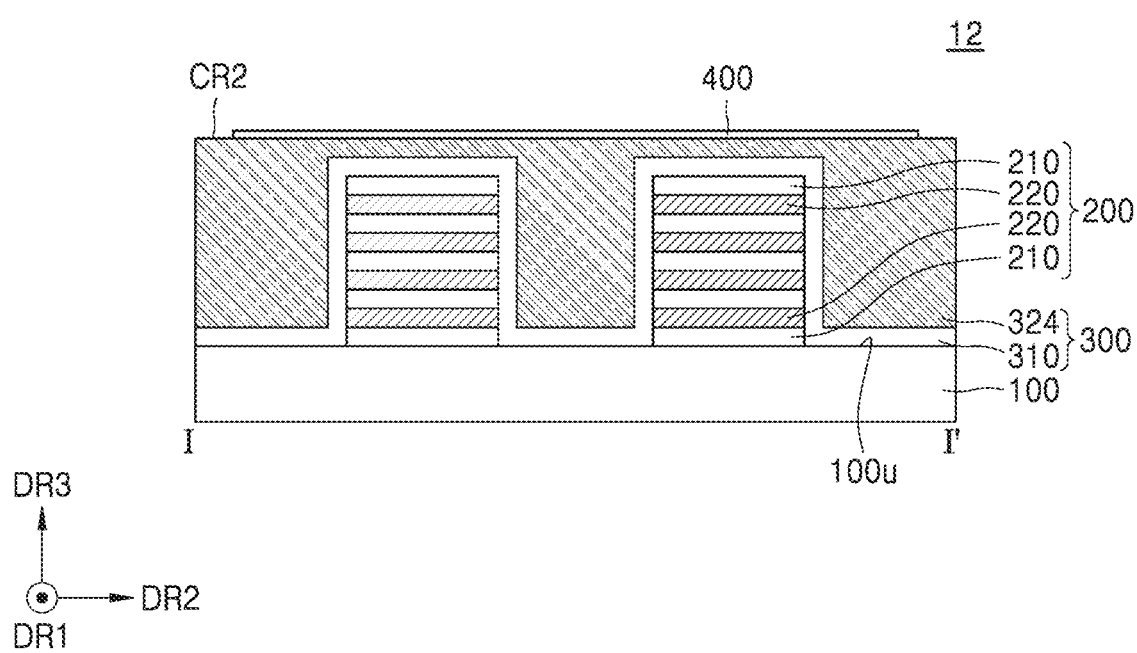
FIG. 12A is a cross-sectional view taken along line I-I' of FIG. 11.
Figure 12B:
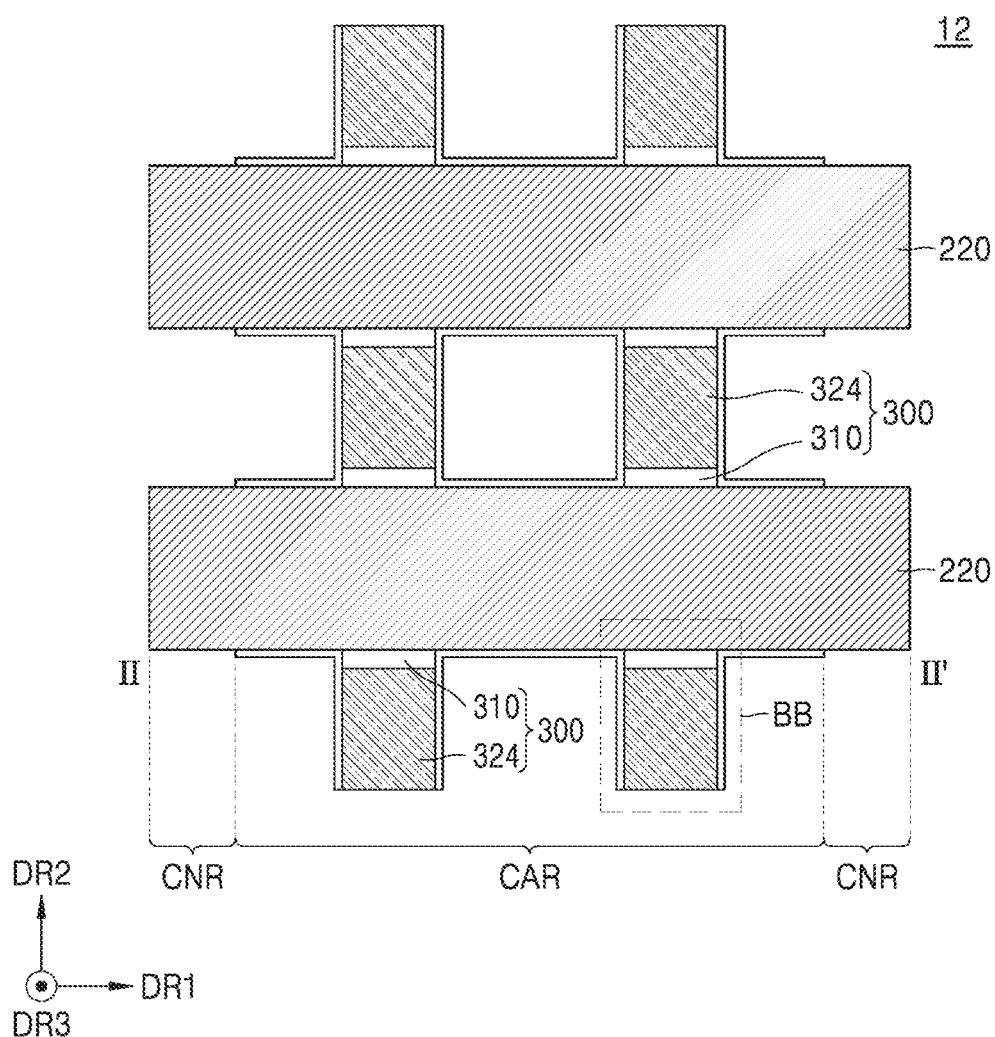
FIG. 12B is a cross-sectional view taken along line II-II' of FIG. 11.
Figure 13:
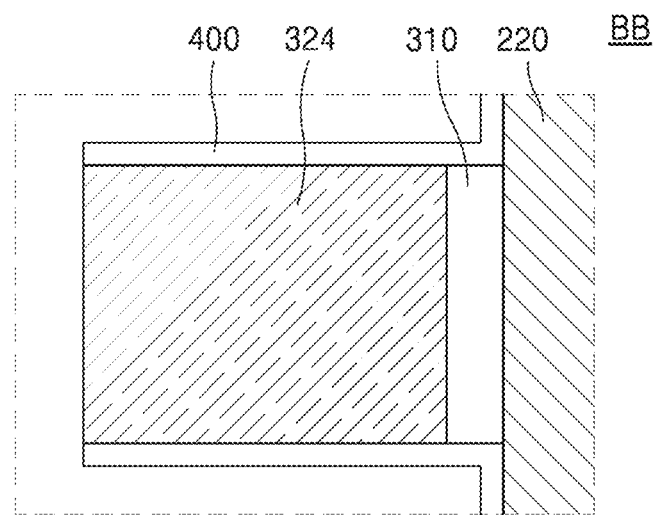
FIG. 13 is a magnified view of a portion BB of FIG. 12B.

FIG. 11 is a perspective view of a semiconductor device 12 according to example embodiments. FIG. 12A is a cross-sectional view taken along line I-I' of FIG. 11. FIG. 12B is a cross-sectional view taken along line II-II' of FIG. 11. FIG. 13 is a magnified view of BB portion of FIG. 12B. Substantially identical contents described with reference to FIGS. 1 through 3 may be omitted.

Referring to FIGS. 11, 12A, and 12B, the semiconductor device 12 including a substrate 100, first electrode structures 200, second electrode structures 300, and a data storage film 400 may be provided. The substrate 100 and the first electrode structures 200 may be substantially identical to the substrate 100 and the first electrode structures 200 described with reference to FIGS. 1 through 3. Similar elements may be omitted from the following description for brevity.

Each of the second electrode structures 300 may include a second insulating pattern 310 and a third electrode pattern 324. The second insulating pattern 310 may be substantially identical to the second insulating patterns 310 described with reference to FIGS. 1 through 3. The third electrode pattern 324 may be substantially identical to the second electrode patterns 320 described with reference to FIGS. 1 through 3 except for the shape of the third electrode pattern 324.

The third electrode pattern 324 may have a thickness that varies along the second direction DR2. The thickness of the third electrode pattern 324 may be a size of the third electrode pattern 324 in the third direction DR3. The thickness of the third electrode pattern 324 may be, e.g. correspond to, a distance between an upper surface of the third electrode pattern 324 and a bottom surface of the third electrode pattern 324. The thickness of the third electrode pattern 324 that overlaps the first electrode structures 200 in the third direction DR3 may be less than a thickness of the third electrode pattern 324 that does not overlap the first electrode structures 200 in the third direction. An upper surface of the third electrode pattern 324 may be arranged on a constant, e.g. a uniform, level. The level may be a distance from the upper surface 100u of the substrate 100. In other words, a distance between the upper surface of the third electrode pattern 324 and the upper surface 100u of the substrate 100 may be constant. The level of the upper surface of the third electrode pattern 324 may be greater than the level of the uppermost level of the second insulating pattern 310.

Example embodiments may provide the semiconductor device 12 having increased cell integrity and/or uniformity and/or reliability.

Figure 14:
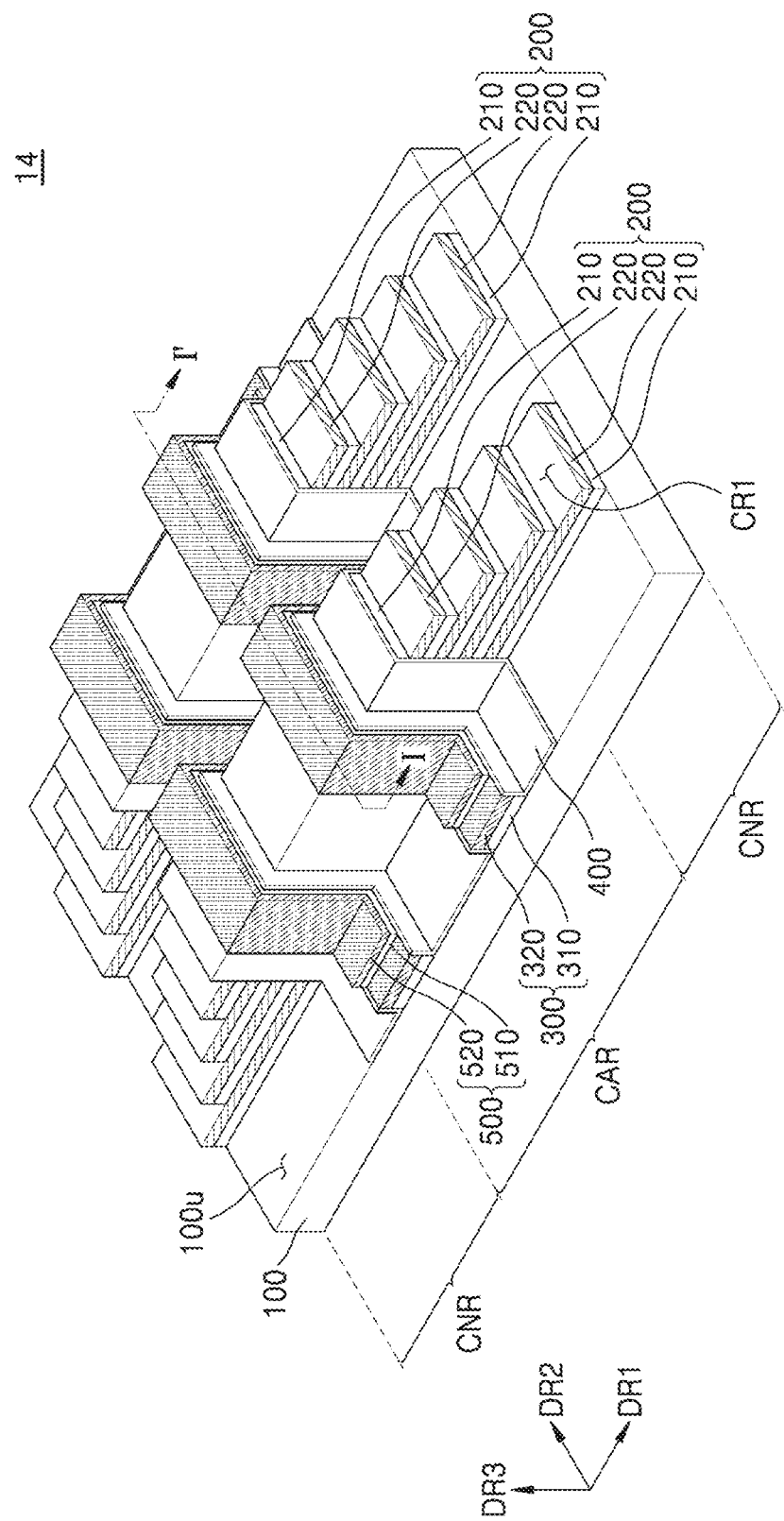
FIG. 14 is a perspective view of a semiconductor device according to example embodiments.
Figure 15A:
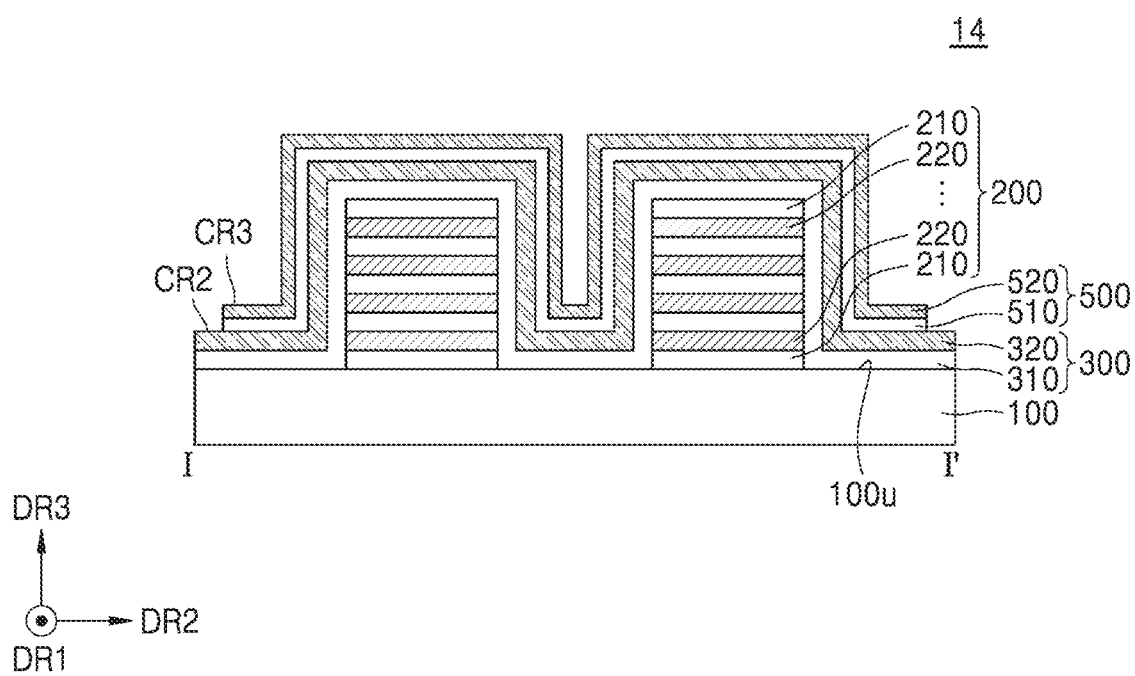
FIG. 15A is a cross-sectional view taken along line I-I' of FIG. 14.
Figure 15B:
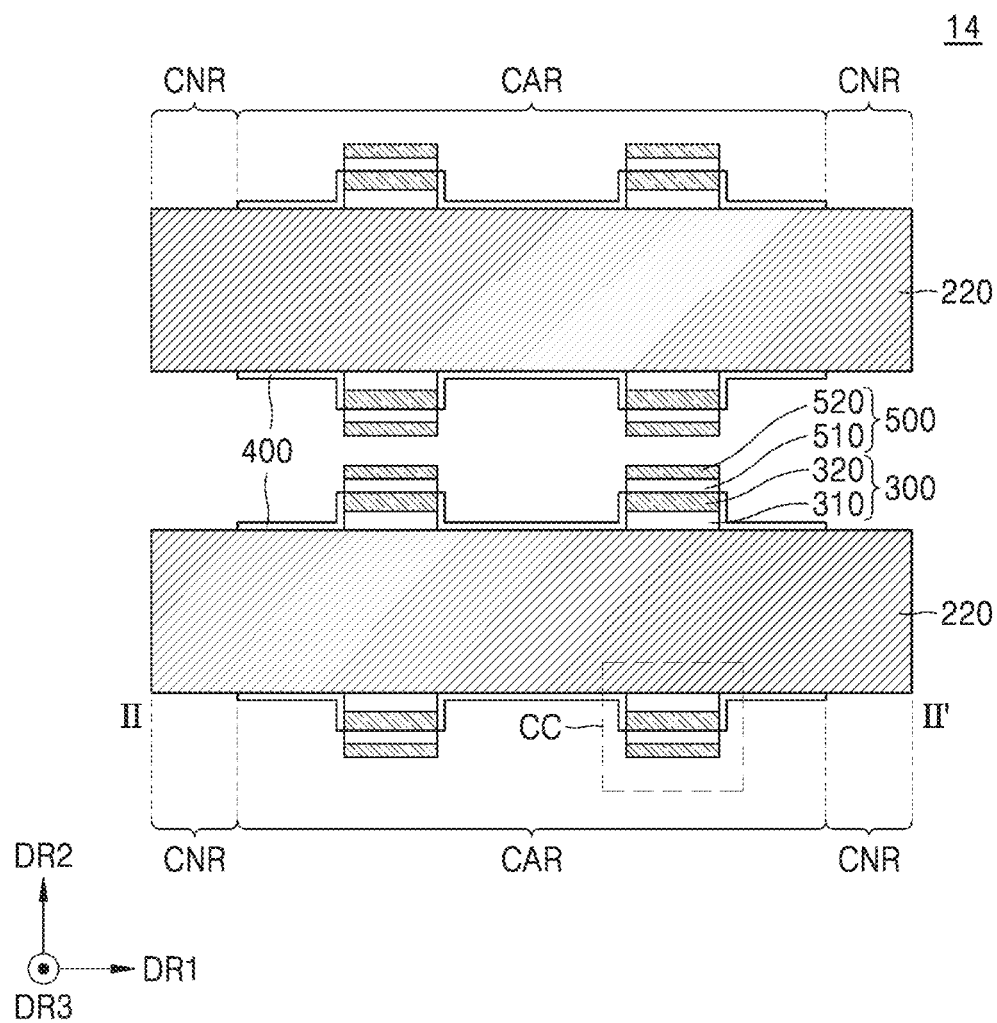
FIG. 15B is a cross-sectional view taken along line II-II' of FIG. 14.
Figure 16:
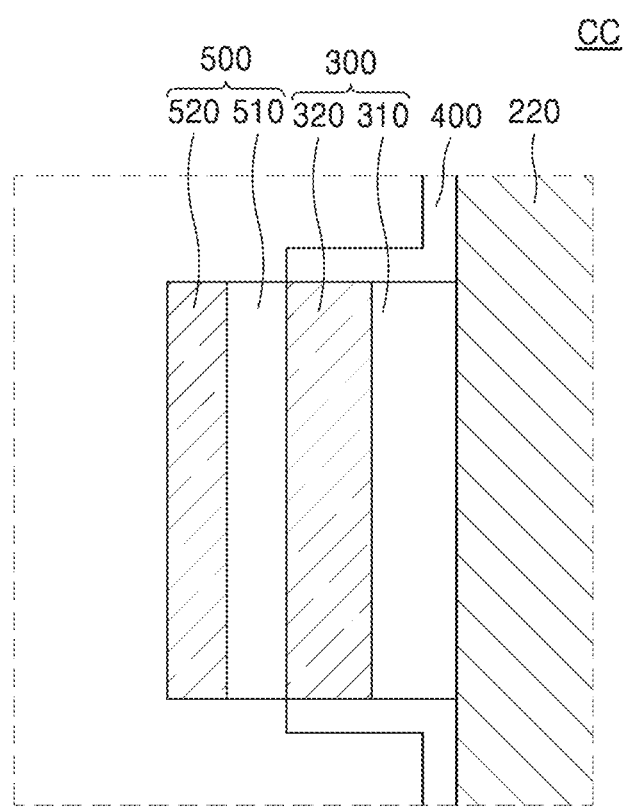
FIG. 16 is a magnified view of portion CC of FIG. 15B.

FIG. 14 is a perspective view of a semiconductor device 14 according to example embodiments. FIG. 15A is a cross-sectional view taken along line I-I' of FIG. 14. FIG. 15B is a cross-sectional view taken along line II-II' of FIG. 14. FIG. 16 is a magnified view of CC portion of FIG. 15B. Substantially identical contents described with reference to FIGS. 1 through 3 may be omitted for brevity.

Referring to FIGS. 14, 15A, 15B, and 16, the semiconductor device 14 including a substrate 100, first electrode structures 200, second electrode structures 300, a selection device structures 500, and a data storage film 400 may be provided. The substrate 100, the first electrode structures 200, and the second electrode structures 300 may be substantially identical to the substrate 100, the first electrode structures 200, and the second electrode structures 300 described with reference to FIGS. 1 through 3.

The selection device structures 500 respectively may be provided on second electrode patterns 320. Each of the selection device structures 500 may include a selection device pattern 510 and a selection device electrode pattern 520 that are sequentially stacked on the second electrode pattern 320. When the data storage film 400 has a characteristic of unipolar resistance switching type, the selection device pattern 510 may include a PN junction diode and/or a Schottky diode. When the data storage film 400 has a characteristic of bipolar resistance switching type, the selection device pattern 510 may include a non-linear selection device and/or a threshold switching device.

The selection device pattern 510 may be electrically connected to the second electrode pattern 320 and the selection device electrode pattern 520. The second electrode pattern 320 and the selection device electrode pattern 520 may be, e.g. correspond to, electrodes of the selection device pattern 510. Unlike the descriptions made with reference to FIGS. 1 through 3, the selection device electrode pattern 520 may be electrically connected to a bit line (not shown) by a third contact (not shown). For example, the third contact may include a conductive material such as a metal and/or doped polysilicon. The selection device electrode pattern 520 may include a third contact region CR3. For example, the third contact may contact, e.g. directly contact, the third contact region CR3. A current may flow through the selection device pattern 510 at required conditions. For example, when the selection device pattern 510 includes a PN junction diode and/or a Schottky diode and when a forward-bias voltage is applied to the selection device pattern 510, a current may flow through the selection device pattern 510. The selection device structures 500 may reduce a leakage current.

The data storage film 400 may be provided on a sidewall surface of the second electrode structures 300. Unlike the descriptions made with reference to FIGS. 1 through 3, the data storage film 400 may not be provided on upper surfaces of the second electrode structures 300. The data storage film 400 may be separated from the selection device structures 500. That is, the data storage film 400 may not contact the selection device pattern 510 and the selection device electrode pattern 520.

The selection device structures 500 may reduce a leakage current. Accordingly, example embodiments may provide the semiconductor device 14 having increased electrical characteristics. Example embodiments may provide the semiconductor device 14 having increased cell integrity, uniformity, and reliability.

Example embodiments may provide a semiconductor device having increased integrity and reliability.

Alternatively or additionally, example embodiments may provide a semiconductor device having increased electrical characteristics.

Alternatively or additionally, example embodiments may provide a method of manufacturing a semiconductor device having increased integrity and reliability.

Alternatively or additionally, example embodiments may provide a method of manufacturing a semiconductor device having increased electrical characteristics.

The foregoing descriptions of example embodiments of the technical aspect of inventive concepts provide an example for the description of inventive concepts. Therefore, the technical sprit of inventive concepts is not limited to the above embodiments, and it will be obvious by those of ordinary skill in the art that various changes in form and details may be made therein without departing from the spirit and scope of the inventive concept.

What is claimed is:

1. A semiconductor device comprising:
a substrate;
a first electrode structure on the substrate, the first electrode structure including first insulating patterns and first electrode patterns, the first insulating patterns alternately stacked with the first electrode patterns;
a second electrode pattern on a sidewall of the first electrode structure; and
a data storage film on a top surface of the second electrode pattern and on a sidewall of the second electrode pattern,
wherein the data storage film has a variable resistance, the first electrode structure comprises a plurality of first electrode structures arranged in a first direction, and the second electrode pattern extends in a second direction, crosses the plurality of first electrode structures in the second direction, and overlaps the plurality of first electrode structures in a third direction perpendicular to an upper surface of the substrate, wherein the data storage film extends on the first electrode patterns and is configured to electrically connect the first electrode pattern to the second electrode pattern.

2. The semiconductor device of claim 1, wherein an oxygen vacancy is inside the data storage film, and the oxygen vacancy changes the resistance of the data storage film.

3. The semiconductor device of claim 2, wherein the data storage film includes a dielectric film in which the oxygen vacancy is mobile.

4. The semiconductor device of claim 1, wherein the data storage film includes a phase change material.

5. The semiconductor device of claim 1, further comprising:
a second insulating pattern between the second electrode pattern and the first electrode structure.

6. The semiconductor device of claim 1, wherein the second electrode pattern extends along a surface of the first electrode structure, and the first electrode structure is between the second electrode pattern and the substrate.

7. The semiconductor device of claim 6, wherein the second electrode pattern has a uniform thickness.

8. The semiconductor device of claim 1, wherein a distance between the top surface of the second electrode pattern and an upper surface of the substrate is uniform.

9. The semiconductor device of claim 1, wherein the second electrode pattern comprises a plurality of second electrode patterns arranged in a first direction, and
the first electrode structure extends in a second direction crossing the plurality of second electrode patterns and overlaps the plurality of second electrode patterns in a third direction perpendicular to an upper surface of the substrate.

10. The semiconductor device of claim 1, wherein the second electrode pattern extends on the substrate, and
the data storage film exposes the second electrode pattern on the substrate.

11. The semiconductor device of claim 1, further comprising:
a selection device structure on a side opposite to the first electrode structure with respect to the second electrode pattern,
wherein when the data storage film has unipolar resistance switching-type characteristics, the selection device structure comprises at least one of a PN junction diode or a Schottky diode, and
when the data storage film has bipolar resistance switching-type characteristics, the selection device structure comprises at least one of a non-linear selection device or a threshold switching device.

12. The semiconductor device of claim 1, wherein the data storage film is directly on the top surface of the second electrode pattern and directly on the sidewall of the second electrode pattern.

13. A semiconductor device comprising:
a substrate including a cell array region and a connection region;
a first electrode structure extending from the cell array region to the connection region;
a second electrode structure on a sidewall of the first electrode structure in the cell array region; and
a data storage film in the cell array region, the data storage film covering the first electrode structure and a top surface of the second electrode structure,
wherein the first electrode structure comprises a plurality of steps in the connection region,
the data storage film has a variable resistance,
the first electrode structure comprises a plurality of first electrode structures arranged in a first direction,
the second electrode structure extends in a second direction, crosses the plurality of first electrode structures in the second direction, and overlaps the plurality of first electrode structures in a third direction perpendicular to an upper surface of the substrate, and
the data storage film extends on the first electrode structure and is configured to electrically connect the first electrode structure to the second electrode structure.

14. The semiconductor device of claim 13, wherein the first electrode structure includes first insulating patterns and first electrode patterns that are alternately stacked on the substrate, and
upper surfaces of the first electrode patterns are exposed in the connection region and are arranged along an extension direction of the first electrode structure.

15. The semiconductor device of claim 14, wherein the second electrode structure includes a second insulating pattern and a second electrode pattern that extend on the substrate.

16. The semiconductor device of claim 1, wherein the data storage film is conformal over the second electrode pattern.

17. The semiconductor device of claim 1, wherein the data storage film is on a first sidewall of the first electrode structure and on a second sidewall of the second electrode pattern, the first sidewall extending in a first direction, the second sidewall extending in a second direction that crosses the first direction.

18. The semiconductor device of claim 1, wherein the data storage film includes a first horizontal portion on a surface of the substrate, a second vertical portion on the sidewall of the first electrode structure, and a second vertical portion on the sidewall of the second electrode pattern.

19. The semiconductor device of claim 18, wherein the data storage film includes a third horizontal portion on an upper surface of the first electrode structure, and
the data storage film includes a fourth horizontal portion on the top surface of the second electrode pattern.

* * * * *